United States Patent
Kawabata et al.

(10) Patent No.: US 7,247,590 B2
(45) Date of Patent: Jul. 24, 2007

(54) COMPOSITE DIELECTRIC, COMPOSITE DIELECTRIC SHEET, COMPOSITE DIELECTRIC PASTE, METAL-LAYERED COMPOSITE DIELECTRIC, WIRING BOARD AND MULTILAYER WIRING BOARD

(75) Inventors: Kenichi Kawabata, Tokyo (JP); Takaaki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 428 days.

(21) Appl. No.: 10/880,568

(22) Filed: Jul. 1, 2004

(65) Prior Publication Data

US 2005/0031849 A1    Feb. 10, 2005

(30) Foreign Application Priority Data

Jul. 4, 2003    (JP)    ............................ P2003-271145

(51) Int. Cl.
  C04B 35/01    (2006.01)
  C09K 19/52    (2006.01)
  B32B 15/09    (2006.01)
  B32B 18/00    (2006.01)
  H05K 1/03     (2006.01)

(52) U.S. Cl. ...................... 501/134; 501/135; 501/136; 501/137; 501/138; 252/299.01; 252/299.67; 428/209; 428/210; 428/325; 428/701; 174/255; 174/257

(58) Field of Classification Search ............ 252/299.01, 252/299.67; 524/494; 528/495; 428/209, 428/210, 325, 701; 174/255, 257; 501/134, 501/135, 136, 137, 138

See application file for complete search history.

(56) References Cited

U.S. PATENT DOCUMENTS 6,838,546 B2 *   1/2005   Okamoto et al. ........... 528/495
6,908,960 B2 *   6/2005   Takaya et al. .............. 524/494

FOREIGN PATENT DOCUMENTS

| JP | A 2002-060595 | 2/2002 |
| JP | A 2002-114894 | 4/2002 |
| JP | A 2002-146003 | 5/2002 |
| JP | A 2002-220444 | 8/2002 |
| JP | A 2002-326312 | 11/2002 |
| JP | A 2002-359145 | 12/2002 |
| JP | A 2004-051867 | 2/2004 |

* cited by examiner

*Primary Examiner*—Shean C Wu
(74) *Attorney, Agent, or Firm*—Oliff & Berridge, PLC

(57) ABSTRACT

The composite dielectric of the present invention contains an aromatic liquid crystal polyester and a dielectric ceramic powder arranged in the aromatic liquid crystal polyester, wherein the dielectric ceramic powder exhibits a Q value greater than 650 at a frequency of 1 GHz by perturbation. A wiring board comprising a composite dielectric sheet made of a composite dielectric having such a characteristic exhibits a high dielectric constant and a low dielectric dissipation factor, thereby yielding less transmission loss, and thus can favorably be used in electronic instruments driven in high-frequency regions.

14 Claims, 6 Drawing Sheets

COMPOSITE DIELECTRIC, COMPOSITE DIELECTRIC SHEET, COMPOSITE DIELECTRIC PASTE, METAL-LAYERED COMPOSITE DIELECTRIC, WIRING BOARD AND MULTILAYER WIRING BOARD

BACKGROUND OF THE INVENTION

1. Field of the Invention

The present invention relates to a composite dielectric, a composite dielectric sheet, a composite dielectric paste, a metal-layered composite dielectric sheet, a wiring board and a multilayer wiring board.

2. Related Background of the Invention

Recently, as information transmitted through electronic devices such as information and communication devices increases, wiring boards and the like mounted to these electronic devices have been required to be applicable to higher frequencies of GHz bands. As the frequency of transmitted signals increases, however, transmission loss tends to increase in the process of transmission, whereby electronic components may disadvantageously generate heat because of the thermal energy caused by the transmission loss, and so forth. In general, such a transmission loss is represented by the following expression:

(transmission loss)=(coefficient)×(frequency)×(dielectric constant)$^{1/2}$×(dielectric dissipation factor).

For reducing the transmission loss, it is desirable that the dielectric constant and dielectric dissipation factor of the substrate material be lower.

As mobile electronic devices come into wider use, there is a strong demand for electronic devices to reduce their size and weight. For this purpose, it is preferable in a wiring board to be mounted that the wavelength of a signal to be transmitted be made shorter so as to reduce the wiring length, and the electrostatic capacity per unit area be increased so as to reduce the electrode area. Such wavelength and electrostatic capacity are represented by the following expressions:

(wavelength)=(light velocity)/((frequency)×(dielectric constant)$^{1/2}$);

(electrostatic capacity value)=(dielectric constant in vacuum)×(relative dielectric constant of material)×(electrode area)/(insulating layer thickness).

Therefore, it is necessary for the substrate material to have a higher dielectric constant in order to shorten the wavelength and increase the electrostatic capacity value.

Hence, for satisfying demands for electronic devices to attain both higher frequency and smaller size, it is necessary to use a substrate material satisfying both characteristics of a higher dielectric constant and a lower dielectric dissipation factor.

Further, for reducing the size and weight of electronic devices, a high-density packaging technique is often used for connecting substrates, electronic components, and devices. Known as such a high-density packaging method is one applying cream solder to devices by using SMT (Surface Mount Technology), and then melting the solder by causing it to reflow, so as to bond the devices together. Recently, from the viewpoint of environmental problems and the like, lead-free solder has become mainstream. In case of applying the lead-free solder, a high temperature is necessary for the solder to reflow. Therefore, a material used for the substrate is desired to be resistant to a high temperature condition on the order of 260° to 280° C.

Characteristics required for the substrate material other than those mentioned above include thinning processability for electronic devices to reduce their size and weight, and lower water absorption for preventing the substrate from deteriorating with time by dielectric characteristics drift.

For responding to such demands, the following various substrate materials have been proposed. Namely, substrate materials such as polyimide, bismaleimide triazine, cyanate ester, polyvinyl benzyl ether, cross linking polyphenylene oxide, a mixed resin of an epoxy resin and an aromatic ester resin, a mixed resin of a phenol resin and an aromatic ester resin, an epoxy resin with a low water absorption and syndiotactic polystyrene, for example, are in use. However, these substrate materials do not satisfy all of the above-mentioned characteristics, and are often insufficient in terms of both characteristics of high heat resistance and low water absorption.

Attention has recently been focused on aromatic liquid crystal polyesters, which are thermoplastic crystalline engineering plastics, as a material adapted to realize characteristics of high heat resistance and low water absorption. Aromatic liquid crystal polyesters have such characteristics as excellent heat resistance and thinning processability, a low water absorption, and a low dielectric dissipation factor in a high frequency region. Accordingly, they are employed for electronic components such as connectors, and their application to a multilayer printed wiring board applicable to high frequencies is under consideration.

Such an aromatic liquid crystal polyester is processed into a sheet by injection molding or extrusion molding. However, in case of these molding methods, it is hard to yield a thin sheet, and the resulting sheet often exhibits anisotropy. Though a method which erases the anisotropy by applying a force in a direction perpendicular to the sheet extruding direction has been under consideration, sheets made of aromatic liquid crystal polyesters tend to exhibit a low dielectric constant in any case, and their dielectric characteristics are insufficient for use as a substrate material.

Therefore, as a substrate material which can achieve a high dielectric constant while taking advantage of such characteristics of aromatic liquid crystal polyesters, a dielectric paste containing an aromatic liquid crystal polyester, a predetermined solvent, and a dielectric powder has been proposed (see, for example, Japanese Patent Application Laid-Open No. 2002-60595).

SUMMARY OF THE INVENTION

Although a dielectric film, mentioned above, consisting of the dielectric paste merely combining the aromatic liquid crystal polyester and dielectric powder has a dielectric characteristic superior to that of a substrate material employed in general, its dielectric dissipation factor tends to become higher than that obtained when the aromatic liquid crystal polyester is used alone as a base resin. Therefore, further studies are required for them to be used as a substrate material applicable to higher frequencies.

In view of the foregoing circumstances, it is an object of the present invention to provide a composite dielectric and a composite dielectric sheet which exhibit not only excellent dielectric characteristics in a high frequency region but also high heat resistance and low water absorption, and can easily form a thin wiring board. It is another object of the present invention to provide a metal-layered composite dielectric sheet, a composite dielectric paste, a wiring board, and a multilayer wiring board which comprise such a composite dielectric sheet.

For achieving the above-mentioned objects, the present invention provides a composite dielectric containing an aromatic liquid crystal polyester and a dielectric ceramic powder provided in the aromatic liquid crystal polyester; wherein the dielectric ceramic powder exhibits a Q value greater than 650 at a frequency of 1 GHz by perturbation method.

Here, the Q value is a value representing the loss of a dielectric, which is a reciprocal (1/tan δ) of dielectric dissipation factor. The Q value at 1 GHz in this case is a value calculated from the displacement of Q values obtained when a sample of the composite dielectric is put into and taken out of a cavity at 1 GHz of an apparatus for measuring a complex dielectric constant using perturbation method with a cavity resonator.

The composite dielectric contains the aromatic liquid crystal polyester, thereby exhibiting such characteristics as a high heat resistance with a low water absorption, a low dielectric dissipation factor in a high frequency region (region of 1 to 5 GHz in particular), and an excellent thinning processability. Also, the composite dielectric of the present invention contains the dielectric ceramic powder in the aromatic liquid crystal polyester such that the Q value at 1 GHz is greater than 650, and thus can attain a higher dielectric constant than that obtained when the aromatic liquid crystal polyester is used alone. As a result, it is possible to satisfy both characteristics of a high dielectric constant and a low dielectric dissipation factor.

Preferably, the aromatic liquid crystal polyester is a polymer soluble in a solvent containing at least 30% by weight of a compound represented by the following general formula (1a) or (1b):

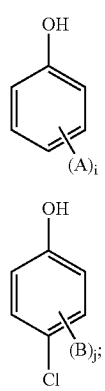

wherein A represents a halogen atom or a trihalogenated methyl group; B represents a hydrogen atom, a halogen atom or a trihalogenated methyl group; i represents an integer of 1 to 5; and j represents an integer of 1 to 4. By utilizing a composite dielectric paste containing such a solvent which dissolves the aromatic liquid crystal polyester in the composite dielectric, a composite dielectric sheet, a wiring board, a multilayer wiring board and the like, which will be explained later, can be easily made.

More specifically, the aromatic liquid crystal polyester is preferably a polymer having an aromatic hydroxycarboxylic acid monomer unit. The aromatic hydroxycarboxylic acid forming the aromatic hydroxycarboxylic acid monomer unit is preferably 2-hydroxy-6-naphthoic acid. When the aromatic liquid crystal polyester has a monomer unit formed by 2-hydroxy-6-naphthoic acid, the resulting composite dielectric yields a better dielectric characteristic.

More preferably, the aromatic liquid crystal polyester is a polymer constituted by 30 to 80 mol % of an aromatic hydroxycarboxylic acid monomer unit, 10 to 35 mol % of an aromatic diol monomer unit and 10 to 35 mol % of an aromatic dicarboxylic acid monomer unit. Here, these ratios are based on the total amount of all monomer units constituting the polymer. When the aromatic hydroxycarboxylic acid monomer unit is less than 30 mol %, the resulting polymer may fail to exhibit a liquid crystal property, thereby lowering its resistance to heat. When this unit exceeds 80 mol %, on the other hand, the melting property of the aromatic liquid crystal polyester and its solubility to the solvent tend to decrease.

When the aromatic liquid crystal polyester is constituted by the above-mentioned monomer units, an aromatic diol forming the aromatic diol monomer unit is preferably 4,4'-dihydroxybiphenyl; and an aromatic dicarboxylic acid forming the aromatic dicarboxylic acid monomer unit is preferably at least one kind of compound selected from the group consisting of terephthalic acid, isophthalic acid and 2,6-naphthalenedicarboxylic acid.

It is preferable that the dielectric ceramic powder contained in the composite dielectric exhibit a dielectric constant of at least 7 but less than 300 and a Q value of at least 700 at a frequency of 1 GHz by perturbation method. When the dielectric ceramic powder contained in the composite dielectric satisfies such a condition, it becomes easier to adjust the Q value of the resulting composite dielectric to a favorable value.

Specifically, the dielectric ceramic powder is preferably a metal oxide powder containing at least one kind of metallic element selected from the group consisting of magnesium, silicon, titanium, zinc, calcium, strontium, zirconium, barium, tin, neodymium, samarium, bismuth, lead, lanthanum, lithium and tantalum. From the viewpoint of improving the strength (bending strength, bend elastic constant, etc.), the dielectric ceramic powder content in the composite dielectric is preferably 11 to 150 parts by volume with respect to 100 parts by volume of the aromatic liquid crystal polyester.

The present invention provides a composite dielectric sheet consisting of the composite dielectric of the present invention. Therefore, this composite dielectric sheet has an excellent dielectric characteristic as with the composite dielectric of the above-mentioned present invention and can favorably be used as a substrate material for a wiring board, etc. Preferably, the composite dielectric sheet has a film thickness of 1 to 1000 μm.

The present invention provides a metal-layered composite dielectric sheet comprising the composite dielectric sheet, and a metal layer provided on at least one face of the composite dielectric sheet. When the metal layer is formed with a predetermined pattern, so as to yield a conductor layer, a wiring board can be made.

The present invention provides a wiring board comprising the composite dielectric of the above-mentioned present invention; and a conductor layer with a predetermined wiring pattern provided on at least one face of the composite dielectric sheet. The present invention also provides a multilayer wiring board comprising a plurality of composite dielectric sheets of the above-mentioned present invention; and a plurality of conductor layers with a predetermined wiring pattern; wherein the plurality of composite dielectric sheets and the plurality of conductor layers are provided alternately. These wiring boards are quite effective as a wiring board used in high-frequency regions, since the composite dielectric sheets formed with conductor layers have excellent dielectric characteristics as mentioned above.

Since the composite dielectric of the present invention has a high dielectric constant and a high Q value, the composite dielectric sheet constituted by the composite dielectric, the wiring board and multilayer wiring board comprising the same have an excellent dielectric characteristic of a high dielectric constant with a low dielectric dissipation factor, thereby yielding a very low transmission loss even in a high frequency region (region of 1 to 5 GHz in particular). Also, the aromatic liquid crystal polyester constituting the composite dielectric has an excellent heat resistance and a low water absorption, so that the resulting wiring board and multilayer wiring board exhibit a high heat resistance and a very small change in dielectric characteristics. Therefore, the wiring board and multilayer wiring board obtained by use of the composite dielectric dispersion of the present invention can favorably be used as a wiring board applicable to high frequencies.

DESCRIPTION OF THE PREFERRED EMBODIMENTS

Figure 1A:
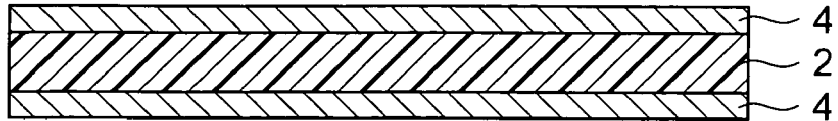
FIGS. 1A, 1B, 1C, 1D and 1E are sectional views showing a process of a first method for making a wiring board.

In the following, preferred embodiments of the present invention will be explained in detail. The embodiments below do not limit the scope of the present invention The composite dielectric of the present invention is constituted by an aromatic liquid crystal polyester and a dielectric ceramic powder provided in the aromatic liquid crystal polyester, and exhibits a Q value greater than 650 at a frequency of 1 GHz by perturbation method. When the Q value of the composite dielectric is 650 or less, the dielectric dissipation factor will become greater, so that the transmission loss in the high frequency region increases disadvantageously. In order for the composite dielectric to have a dielectric dissipation factor falling within a more favorable range, the Q value is preferably greater than 650 at 2 GHz, and more preferably at least 700 at 1 GHz. In the following, individual ingredients constituting the composite dielectric of the present invention will be explained.

Aromatic Liquid Crystal Polyester

The aromatic liquid crystal polyester used in the composite dielectric of the present invention is a so-called thermotropic liquid crystal polymer exhibiting an optical anisotropy when melted. As such an aromatic liquid crystal polyester, a polymer including an aromatic hydroxycarboxylic acid as a monomer unit is preferable. More preferably, the polymer substantially constituted by an aromatic hydroxycarboxylic monomer unit, an aromatic diol monomer unit and an aromatic dicarboxylic acid monomer unit.

Examples of the aromatic hydroxycarboxylic monomer unit include those having respective structures of the following formulas (2a), (2b), (2c),(2d), (2e) and (2f):

(2a)

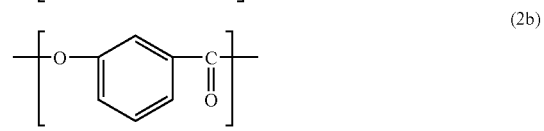

(2b)

(2c)

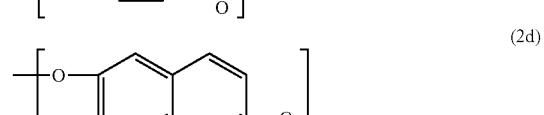

(2d)

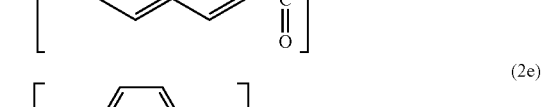

(2e)

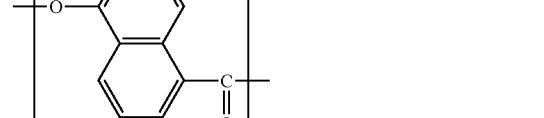

(2f)

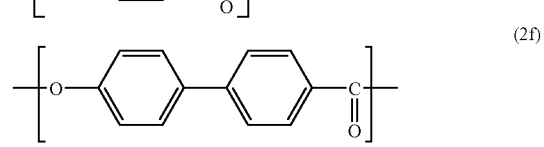

The aromatic rings in the above formulas may further be substituted by alkyl groups such as halogen atoms, alkyl groups such as methyl group and ethyl group, or aryl groups. Among these aromatic hydroxycarboxylic acid monomer units, the monomer unit derived from 2-hydroxy-6-naphthoic acid represented by the above-mentioned formula (2d) is preferred in particular.

Examples of the aromatic diol monomer unit include those having respective structures represented by the following formulas (4a), (4b), (4c), (4d), (4e), (4f), (4g), (4h), (4i) and (4j):

(4a)

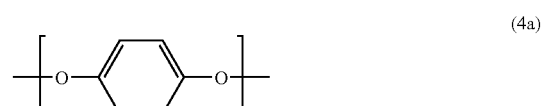

(4b)

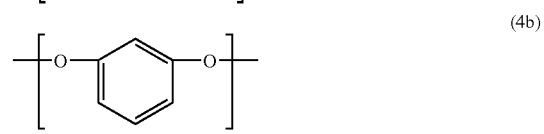

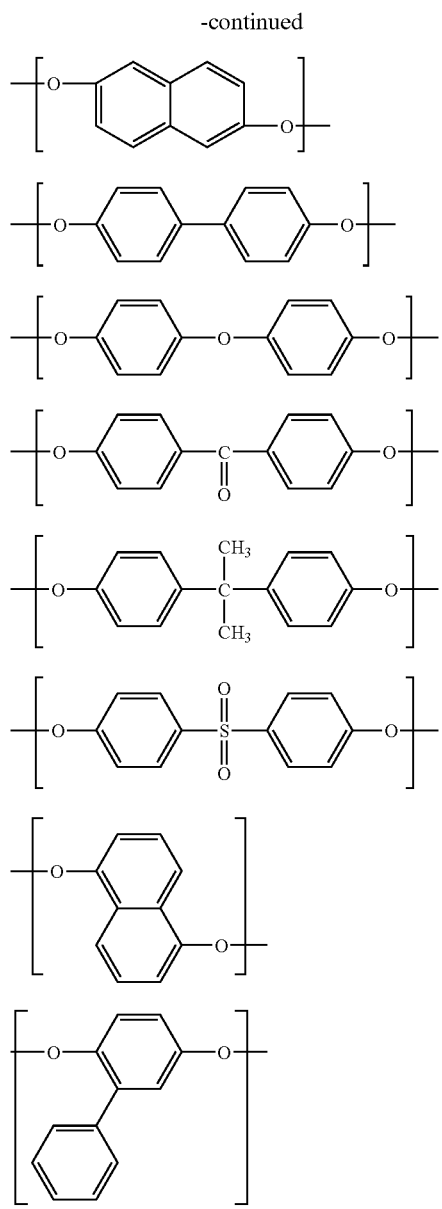

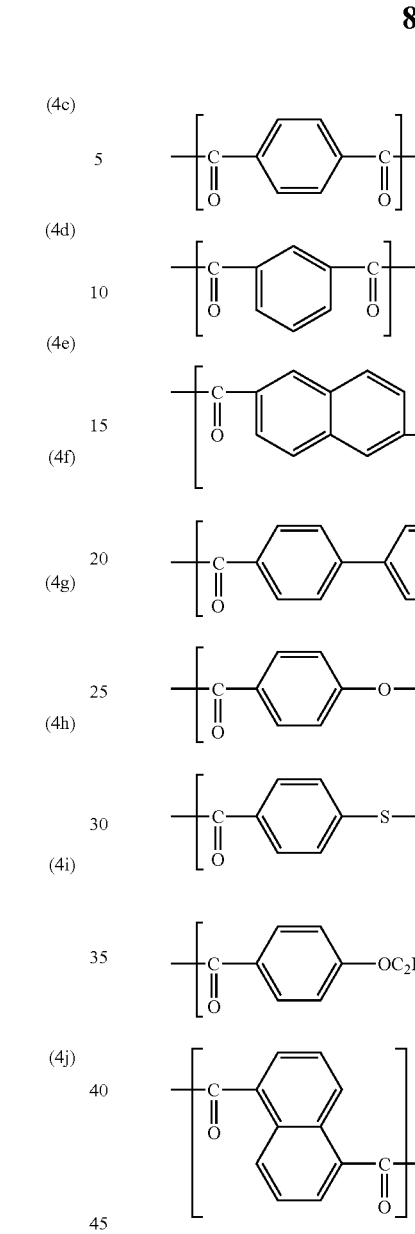

The aromatic rings in the above formulas may be substituted by halogen atoms, alkyl groups or aryl groups. It is preferable that the alkyl group have a carbon number of 1 to 10. It is also preferable that the aryl group have a carbon number of 6 to 20.

Examples of the aromatic diol forming the aromatic diol monomer unit include hydroquinone, resorcinol, 4,4'-dihydroxybiphenyl, bisphenol-A and bisphenol-S. These aromatic diols may be used one by one or in combination of two or more. Among them, from the viewpoint of improving the heat resistance and lowering the linear expansion, 4,4'-dihydroxybiphenyl, which yield the monomer unit represented by the above-mentioned expression (4d), is preferred in particular.

Example of the preferred aromatic dicarboxylic acid monomer unit include those having respective structures represented by the following expressions (5a), (5b), (5c), (5d), (5e), (5f), (5g) and (5h):

The aromatic rings in the above formulas may be substituted by halogen atoms, alkyl groups, or aryl groups. It is preferable that the alkyl group have a carbon number of 1 to 10. It is also preferable that the aryl group have a carbon number of 6 to 20.

Examples of the aromatic dicarboxylic acid forming the aromatic dicarboxylic acid monomer unit include terephthalic acid, isophthalic acid and 2,6-naphthalenedicarboxylic acid. Specifically, terephthalic acid or 2,6-naphthalenedicarboxylic acid is preferred from the viewpoint of improving the heat resistance, 2,6-naphthalene dicarboxylate is preferred from the viewpoint of lowering the linear expansion, and isophthalic acid is preferred from the viewpoint of improving the solubility to a solvent.

Preferably, respective ratios of the above-mentioned individual monomer units to the total amount of all monomer units constituting the aromatic liquid crystal polyester are adjusted as set forth in the following.

The ratio of the aromatic hydroxycarboxylic acid monomer unit is preferably 30 to 80 mol %, more preferably 35 to 70 mol %, further preferably 40 to 70 mol %. When the hydroxycarboxylic acid monomer unit content is less than 30 mol %, the resulting polymer tends to fail to show a liquid crystal property, whereby the composite dielectric tends to lower its heat resistance, etc. When the ratio exceeds 80 mol %, the resulting polymer tends to be harder to melt or dissolve into a solvent, whereby the composite dielectric tends to be harder to handle.

The ratio of the aromatic diol monomer unit is preferably 10 to 35 mol %, more preferably 12.5 to 32.5 mol %, further preferably 15 to 30 mol %.

The ratio of the aromatic dicarboxylic acid monomer unit is preferably 10 to 35 mol %, more preferably 12.5 to 32.5 mol %.

The ratio between the aromatic diol monomer unit and the aromatic dicarboxylic acid monomer unit in the aromatic liquid crystal polyester is preferably such that the (aromatic dicarboxylic acid monomer unit)/(aromatic diol monomer unit)=95/100 to 100/95 in terms of molar ratio. When the molar ratio is outside of this range, the resulting aromatic liquid crystal polyester may fail to attain a sufficiently high molecular weight, whereby the mechanical strength (bending strength, bend elastic constant, etc.) of the composite dielectric tends to decrease.

From the viewpoint of improving the mechanical strength of the composite dielectric, it is preferable for the aromatic liquid crystal polyester to have a certain extent of molecular weight or greater. As a consequence, the limiting viscosity of the aromatic liquid crystal polyester is preferably at least 0.3, more preferably at least 0.5. When the molecular weight of the aromatic liquid crystal polyester is too large, the melt viscosity and solution viscosity tend to increase disadvantageously, thereby lowering the processability. From this viewpoint, the limiting viscosity is preferably 5 or less, more preferably 3.3 or less. Considering the balance between the mechanical strength and processability of the resulting composite dielectric, the limiting viscosity of the aromatic liquid crystal polyester is preferably 0.5 to 3.0.

The above-mentioned aromatic liquid crystal polyester can be produced by the methods disclosed in Japanese Patent Application Laid-Open Nos. 2002-220444 and 2002-146003, for example. Namely, it can be synthesized by acylating an aromatic hydroxycarboxylic acid and/or aromatic diol with an excess amount of a fatty acid anhydride and then causing an ester exchange (polycondensation) reaction between the resulting acylated product and an aromatic hydroxycarboxylic acid and/or aromatic dicarboxylic acid.

In such a producing method, the acylation reaction can be carried out by adding preferably 1.0 to 1.2 equivalents, more preferably 1.05 to 1.1 equivalents, against a phenolic hydroxyl group of the aromatic hydroxycarboxylic acid, and preferably at 130° to 180° C. for 5 minutes to 10 hours, more preferably at 140° to 160° C. for 10 minutes to 3 hours. When the amount of addition of the fatty acid anhydride is less than 1.0 equivalent in the acylation reaction, the acylated product and aromatic hydroxycarboxylic acid may sublime during the reaction, so as to block the reaction system, and so forth, thereby hindering the reaction from proceeding. When the amount exceeds 1.2 equivalents, on the other hand, the resulting aromatic liquid crystal polyester tends to be colored disadvantageously.

Examples of the fatty acid anhydride used in the acylation reaction include acetic anhydride, propionic anhydride, butyric anhydride, isobutyric anhydride, valeric anhydride, pivalic anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, glutaric anhydride, maleic anhydride, succinic anhydride and β-bromopropionic anhydride. These fatty acid anhydride may be used one by one or in combination of two or more. Among them, from the viewpoints of cost and handling, acetic anhydride, propionic anhydride, butyric anhydride and isobutyric anhydride are preferred. In particular, acetic anhydride is preferred.

The ester exchange reaction can be carried out by mixing the acylated product with the aromatic hydroxycarboxylic acid and/or aromatic dicarboxylic acid such that the acyl group in the former is 0.8 to 1.2 equivalents against the carboxyl group in the latter, and causing them to react while preferably raising temperature at a rate of 0.1° to 50° C./min between 130° to 400° C., more preferably at a rate of 0.3° to 5° C./min between 150° to 350° C. Preferably, the ester exchange reaction is carried out while removing fatty acids occurring as a byproduct during the reaction and unreacted fatty acid anhydride by evaporation and the like in order for the reaction to achieve a chemical equilibrium advantageous for generating a product.

Though the polycondensation reaction caused by the ester exchange reaction is usually carried out by melt polymerization, the melt polymerization and solid-state polymerization may be carried out together when synthesizing the above-mentioned aromatic liquid crystal polyester. In this case, after conducting the polymerization reaction by the melt polymerization, the generated polymer is taken out, and then is pulverized, and so forth, so as to yield a powder or flake, with which the solid-state polymerization is carried out by a known method, whereby the aromatic liquid crystal polyester is obtained. In the solid-phase reaction, the solid-phase polymer may be caused to react with a solution while stirring the solution or while they stand still without stirring the solution. Separate reaction vessels may be used for the melt polymerization and solid-state polymerization, or both reactions may continuously be carried out in a single reaction vessel equipped with an appropriate stirring mechanism.

The above-mentioned acylation reaction and ester exchange reaction may be carried out in the presence of a catalyst. As the catalyst in this case, those usually used for polymerization of polyesters can be employed. Specific examples of the catalyst include metal salt catalysts such as magnesium acetate and stannous sulfate, and organic compound catalysts such as N,N'-dimethylaminopyridine and N-methyl imidazole. In particular, heterocyclic compounds such as N,N'-dimethylaminopyridine and N-methyl imidazole, each having two or more nitrogen atoms, are used preferably. When using a catalyst in the acylation reaction, the catalyst is preferably added to monomers to react. After the acylation reaction is terminated in this case, the ester exchange reaction can be carried out directly without removing the catalyst and so forth in particular.

Dielectric Ceramic Powder

The composite dielectric of the present invention contains a dielectric ceramic such that the Q value of the composite dielectric at 1 GHz is greater than 650 when measured by perturbation method. It is preferable that the dielectric ceramic powder exhibit dielectric constant and Q value in a high-frequency region of 100 MHz or higher, desirably in a near microwave region of 1 GHz or higher, greater than those of the aromatic liquid crystal polyester acting as a base resin. It is more preferable that the dielectric ceramic powder exhibit a dielectric constant of at least 7 but less than 300 and a Q value of 700 or greater at a frequency of 1 GHz, both of which are greater than those of the base resin. Choosing a dielectric ceramic powder having such a characteristic, it can be easily achieved to adjust the dielectric constant and Q value of the resulting composite dielectric to favorable values, so as to provide the composite dielectric with excellent dielectric characteristics.

Examples of the dielectric ceramic powder include metal oxide powders containing at least one kind of metallic element selected from the group consisting of magnesium, silicon, titanium, zinc, calcium, strontium, zirconium, barium, tin, neodymium, samarium, bismuth, lead, lanthanum, lithium, and tantalum.

Specific examples of the dielectric ceramic powder include $Mg_2SiO_4$ ($\in$=7, Q=20000), $MgTiO_3$ ($\in$=17, Q=22000), $ZnTiO_3$ ($\in$=26, Q=800), $Zn_2TiO_4$ ($\in$=15, Q=700), $CaTiO_3$ ($\in$=170, Q=1800), $SrZrO_3$ ($\in$=30, Q=1200), $Ba_2Ti_9O_{20}$ ($\in$=39, Q=9000), $Ba_2(Ti, Sn)_9O_{20}$ ($\in$=37, Q=5000), $ZrTiO_4$ ($\in$=39, Q=7000), $(Zr, Sn)TiO_4$ ($\in$=38, Q=7000), $BaNd_2Ti_5O_{14}$ ($\in$=83, Q=2100), $BaNd_2Ti_4O_{12}$ ($\in$=92, Q=1700), $BaSm_2TiO_{14}$ ($\in$=74, Q=2400), $BaO-CaO-Nd_2O_3-TiO_2$ system ($\in$=90, Q=2200), $BaO-SrO-Nd_2O_3-TiO_2$ system ($\in$=90, Q=1700), $Bi_2O_3-BaO-Nd_2O_3-TiO_2$ system ($\in$=88, Q=2000), $PbO-BaO-Nd_2O_3-TiO_2$ system ($\in$=90, Q=5200), $(Bi_2O_3, PbO)-BaO-Nd_2O_3-TiO_2$ system ($\in$=105, Q=2500), $La_2Ti_2O_7$ ($\in$=44, Q=4000), $Nd_2Ti_2O_7$ ($\in$=37, Q=1100), $(Li, Sm)TiO_3$ ($\in$=81, Q=2050), $Ba(Mg_{1/3}Nd_{2/3})O_3$ ($\in$=25, Q=35000), $Ba(Zn_{1/3}Ta_{2/3})O_3$ ($\in$=30, Q=14000), $Ba(Zn_{1/3}Nd_{2/3})O_3$ ($\in$=41, Q=9200) and $Sr(Zn_{1/3}Nd_{2/3})O_3$ ($\in$=40, Q=4000). These metal oxide may be used one by one or in combination of two or more.

Particles in such a dielectric ceramic powder may have any form such as spherical, cylindrical, acicular, and amorphous forms, a plurality of kinds of which may be mixed together. Their average particle size is preferably smaller than the sheet thickness when forming a composite dielectric sheet which will be explained later, and is more preferably one-half or less of the sheet thickness. When taking account of the dispersibility into the aromatic liquid crystal polyester as well, the average particle diameter in the dielectric ceramic powder is preferably 0.01 to 100 µm, more preferably 0.2 to 20 µm. When the average particle size is less than 0.01 µm, the resulting composite dielectric paste tends to increase its viscosity and melt viscosity, whereby it tends to become harder to form a composite dielectric sheet. Also, when the average particle size is less than 0.01 µm, the adhesion to a metal foil or the like of a composite dielectric sheet formed by the composite dielectric tends to decrease. When the average particle size exceeds 100 µm, on the other hand, the dielectric ceramic powder may precipitate and so forth at the time of preparing the composite dielectric paste, thereby failing to disperse uniformly into the aromatic liquid crystal polyester.

The content of dielectric ceramic powder in the composite dielectric is preferably such an amount as to be 11 to 150 parts by volume against 100 parts by volume of the aromatic liquid crystal polyester, and can appropriately be selected within this range in accordance with intended dielectric characteristics of the composite dielectric such as dielectric constant and Q value. When the content of dielectric ceramic powder is less than 11 parts by volume, the composite dielectric is less likely to attain sufficiently high dielectric constant and Q value. When the content exceeds 150 parts by volume, on the other hand, the composite dielectric paste tends to lower coatability in the process of obtaining the composite dielectric sheet, and thus obtained sheet tends to decrease adhesion to a metal foil.

The composite dielectric of the present invention contains the above-mentioned aromatic liquid crystal polyester and dielectric ceramic powder as explained in the foregoing, and may further contain other ingredients within such a range that characteristics (heat resistance, dielectric characteristics, etc.) of the composite dielectric are not lost significantly. Examples of the other ingredients include thermoplastic resins such as polypropylene, polyamide, polyester, polyphenylene sulfide, polyether ketone, polycarbonate, polyether sulfone, polyphenylene oxide and its denatured products, and polyether imide; diblock or triblock copolymers of glycidyl methacrylate and polyethylene or polystyrene; and polybutadiene and its hydrogenated products. These ingredients may be used one by one or in combination of two or more.

Composite Dielectric Sheet

The composite dielectric sheet of the present invention is obtained by shaping the composite dielectric of the present invention into a sheet. Such a composite dielectric sheet can be formed by removing the solvent from the composite dielectric paste obtained by dissolving or dispersing the composite dielectric into a solvent such as an organic solvent.

Specifically, after the composite dielectric paste is applied onto a support, the solvent is removed from thus applied composite dielectric, so as to form a layer of the composite dielectric. Thereafter, the support is removed from the layer of composite dielectric, whereby the composite dielectric sheet can be formed. In this case, metal foils, resin films, etc. can be used as the support without any restrictions in particular. The support can be removed, for example, by dipping the product into a solution which can dissolve only the support employed.

For applying the composite dielectric onto the support, conventionally known coating methods can be employed without any restrictions in particular. Examples of such methods include doctor blading, spin coating, curtain coating, spray coating, and screen printing. The thickness of thus applied composite dielectric paste is preferably 1 to 1000 µm, more preferably 1 to 100 µm. When the coating thickness of composite dielectric paste is less than 1 µm, it is less likely to cover the whole surface of the support, which is a base to be coated therewith, thereby making it harder to form the composite dielectric sheet. When the thickness exceeds 1000 µm, on the other hand, it tends to become difficult for the solvent to be removed, whereby the composite dielectric layer may be hard to form with a uniform thickness, and so forth.

For removing the solvent from the applied composite dielectric paste, a method in which the solvent is evaporated by heating is preferred. Blowing with a hot wind simultaneously with heating can make it easier to remove the solvent. Though appropriately changeable depending on the thickness of the applied composite dielectric paste, the heating condition in this case usually falls within the ranges of 80° to 330° C. and 3 to 300 minutes. For removing the solvent as such, step drying in which the heating condition is divided into some steps can be carried out as well.

Preferred as an organic solvent for dissolving or dispersing the composite dielectric paste when preparing the composite dielectric paste is one which can dissolve the aromatic liquid crystal polyester in the composite dielectric. An example of such a solvent is one containing at least 30% by weight of a compound represented by the following general formula (1a) or (1b):

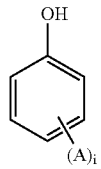

(1a)

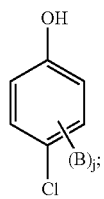

(1b)

wherein A represents a halogen atom or a trihalogenated methyl group; B represents a hydrogen atom, a halogen atom or a trihalogenated methyl group; i represents an integer of 1 to 5; and j represents an integer of 1 to 4. When i or j is at least 2, a plurality of A or B may be either identical to each other or different from each other.

Specific examples of the compound represented by the above-mentioned general formula (1a) or (1b) include pentafluorophenol, tetrafluorophenol, o-chlorophenol, p-chlorophenol, 3,5-bistrifluoromethyl phenol, 2,4-dichlorophenol, 2,4,5-trichlorophenol, 2,4,6-trichlorophenol, and pentachlorophenol. Among them, p-chlorophenol, 2,4-dichlorophenol and 3,4-dichlorophenol can favorably be used since the solubility of the aromatic liquid crystal polyester is high therein and they are easily available.

From the viewpoint of improving the solubility of the aromatic liquid crystal polyester, the solubility at a low temperature in particular, the content of the compound represented by the above-mentioned general formula (1a) or (1b) in the solvent is preferably at least 60% by weight, more preferably 100% by weight with substantially no other ingredients.

The content of aromatic liquid crystal polyester in the composite dielectric paste is preferably 0.1 to 100 parts by weight, more preferably 1 to 10 parts by weight, against 100 parts by weight of the solvent. When the content is less than 0.1 part by weight, it becomes harder to remove the solvent, so that the productivity tends to deteriorate when forming the composite dielectric sheet. When the content exceeds 100 parts by weight, the solubility of aromatic liquid crystal polyester to the solvent tends to decrease, so that a uniform sheet is harder to obtain.

Metal-Layered Composite Dielectric Sheet

The composite dielectric sheet of the present invention comprises a metal layer, made of a conductive metal, on at least one face of the composite dielectric sheet. The metal constituting the metal layer is not restricted in particular as long as it is a conductive metal. Examples of the metal include gold, silver, copper, aluminum, nickel, tin, and nickel/chromium alloys. Copper and aluminum are preferred, since they are easily available at a low cost.

The following are examples of methods of forming the metal layer on the composite dielectric sheet. Namely, there are (1) a method comprising the steps of applying the above-mentioned composite dielectric paste onto a metal foil such as an electrolytic foil or rolled foil, and then removing the solvent; (2) a method comprising the steps of attaching a metal foil such as an electrolytic foil or rolled foil to the composite dielectric sheet, and melting the aromatic liquid crystal polyester in the composite dielectric sheet by heating or the like, so as to bond the metal foil thereto; (3) a method directly forming the metal layer on the composite dielectric sheet by plating (electroless plating, electrolytic plating, or their combination), sputtering, vapor deposition, etc. In the method of (3), the surface of the composite dielectric sheet may be subjected to corona discharge, UV irradiation, plasma treatment, etc. The thickness of thus formed metal layer is preferably 3 to 70 μm, more preferably 9 to 35 μm, when a metal foil is used. And the thickness is preferably 500 Å to 50 μm in the case of plating, sputtering, vapor deposition, etc.

Wiring Board and Multilayer Wiring Board

The wiring board of the present invention comprises a conductor layer having a predetermined pattern on at least one face of the composite dielectric sheet. Examples of the material constituting the conductor layer in this case are conductive metals. A metal similar to that used in the metal-layered composite dielectric sheet can be used.

Figure 1B:
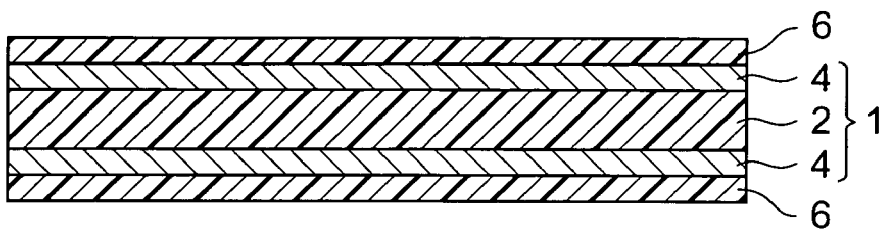

Such a wiring board can be made by the following first to fourth methods, for example. FIGS. 1A to 1E are sectional views showing a process of the first method for making the wiring board. In the first method, a metal-layered composite dielectric sheet 1 comprising metal layers 4 on both sides of a composite dielectric sheet 2 is initially prepared (FIG. 1A). Subsequently, resist layers 6 made of a conventionally known photosensitive resin or the like are formed on the respective metal layers 4 in the metal-layered composite dielectric sheet 1 (FIG. 1B). Examples of the method of forming the resist layers 6 on the metal layers 4 include: one comprising the steps of applying a varnish of the photosensitive resin or the like by doctor blading, spin coating, curtain coating, spray coating, screen printing, or the like, and then drying; one laminating a film of the photosensitive resin; etc.

Figure 1C:
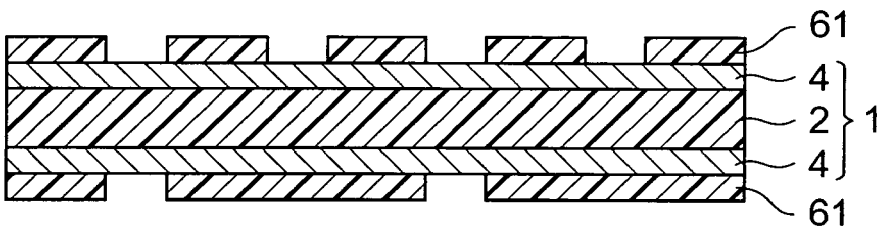
Figure 1D:
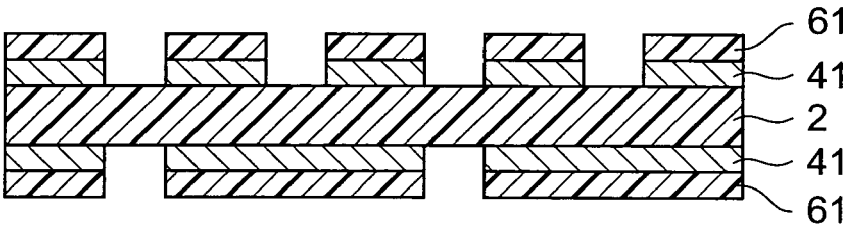
Figure 1E:
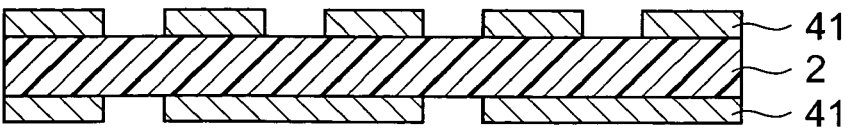

The resist layers 6 thus formed on the metal layers 4 are exposed to light and developed by a known method, so as to form masks 61 patterned such as to cover parts to be formed with circuits in the metal layers 4 (FIG. 1C). Subsequently, the parts of metal layers 4 not covered with the masks 61 are etched away, so as to form conductor layers 41 (FIG. 1D). Thereafter, the masks 61 are eliminated, whereby a wiring board 10a in which the conductor layers 41 having predetermined patterns are formed on both faces of the composite dielectric sheet 2 is obtained (FIG. 1E). Such a method of making a wiring board is usually referred to as subtractive method. The two conductor layers 41 in the wiring board 10a may have either the same pattern or different patterns.

Figure 2A:
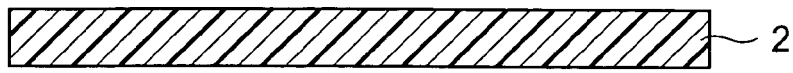
FIGS. 2A, 2B, 2C, 2D, 2E, 2F and 2G are sectional views showing a process of a second method for making a wiring board.
Figure 2B:
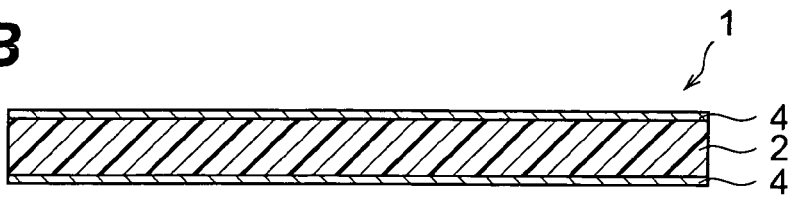
Figure 2C:
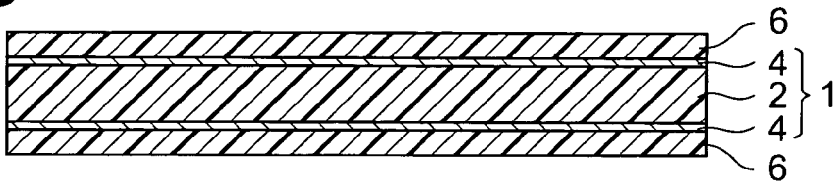
Figure 2D:
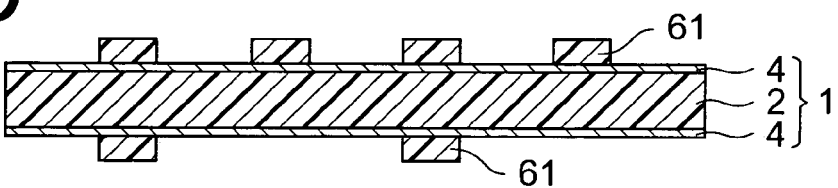

FIGS. 2A to 2G are sectional views showing a process of the second method for making the wiring board. In the second method, a composite dielectric sheet 2 is initially prepared (FIG. 2A). Subsequently, metal layers 4 are formed on both faces of the composite dielectric sheet (FIG. 2B). In this case, the metal layers 4 are preferably thin metal layers of about 5 μm or smaller, since metal layers 7 will further be formed thereon in a later step. Such thin metal layers 4 can be formed by a method of press-bonding thin metal foils to both faces of the composite dielectric sheet 2; a method of forming thick metal layers and then thinning them by half-etching; a method of forming thin metal films on the faces of the composite dielectric sheet 2 by electroless plating, sputtering, vapor deposition, and the like; etc. Subsequently, resist layers 6 are formed on thus formed metal layers 4 (FIG. 2C) and then are exposed to light and developed by a known conventionally method, whereby masks 61 patterned so as to expose parts to be formed with circuits in the metal layers 4 are formed (FIG. 2D).

Figure 2E:
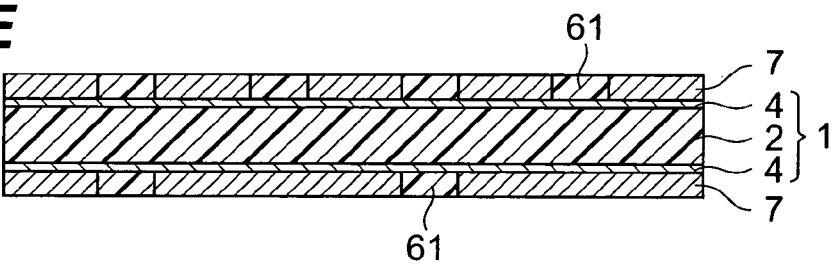
Figure 2F:
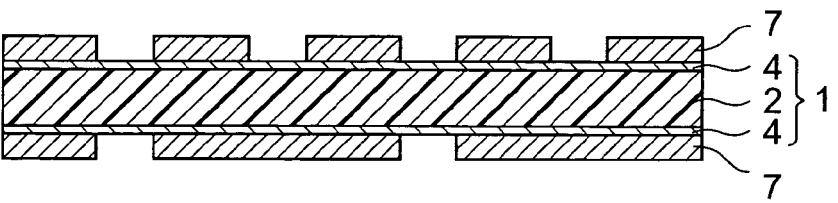
Figure 2G:
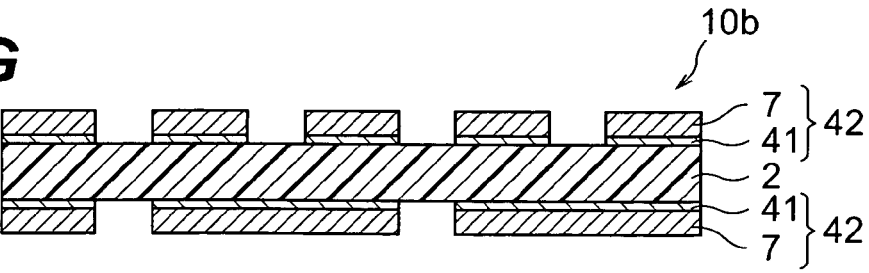

Next, on the parts of metal layers 4 not covered with the masks 61, metal layers 7 made of a metal identical to or different from the metal of the metal layers 4 are formed by electroless plating or the like (FIG. 2E). Then, the masks 61 on the metal layer 4 are eliminated (FIG. 2F). Thereafter, by a conventionally known soft etching method or the like, the metal layers 4 are eliminated from the parts not formed with the metal layers 7, whereby a wiring board 10b in which conductor layers 42 constituted by patterned conductor layers 41 and metal layers 7 are formed on both faces of the composite dielectric sheet 2 is obtained (FIG. 2G). Such a method of making a wiring board is usually referred to as additive method. In this case, the two conductor layers 42 in the wiring board 10b may have either the same pattern or different patterns as with the wiring board 10a.

Figure 3A:
FIGS. 3A, 3B and 3C are sectional views showing a process of a third method for making a wiring board.
Figure 3B:
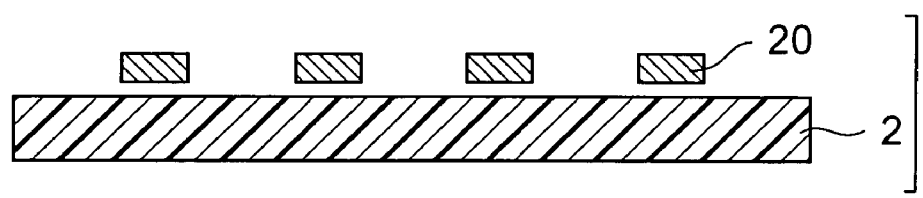
Figure 3C:
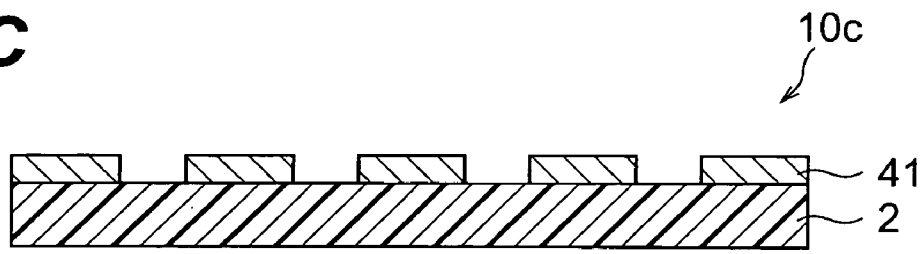

FIGS. 3A to 3C are sectional views showing a process of the third method for forming the wiring board. In the third method, a composite dielectric sheet 2 is initially prepared (FIG. 3A). On this composite dielectric sheet 2, a mask 20 patterned so as to expose parts to be formed with a circuit in the wiring board is disposed (FIG. 3B). Through the mask 20, sputtering, vapor deposition, or the like is carried out so as to form a conductor layer 41 having a predetermined pattern directly on the composite dielectric sheet 2, thus yielding a wiring board 10c (FIG. 3C).

Figure 4A:
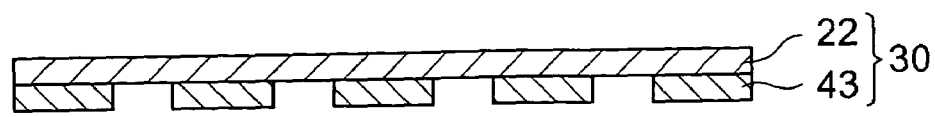
FIGS. 4A, 4B, 4C and 4D are sectional views showing a process of a fourth method for making a wiring board.
Figure 4B:
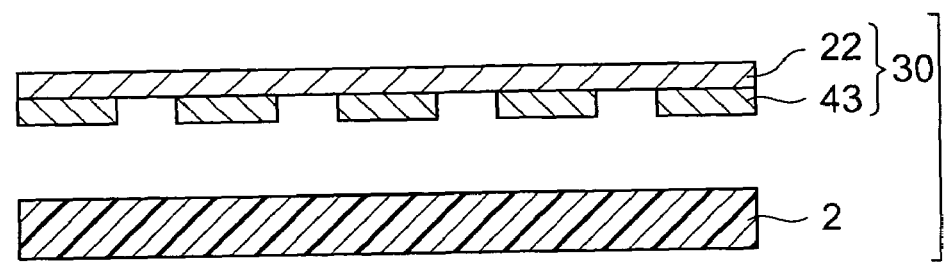
Figure 4C:
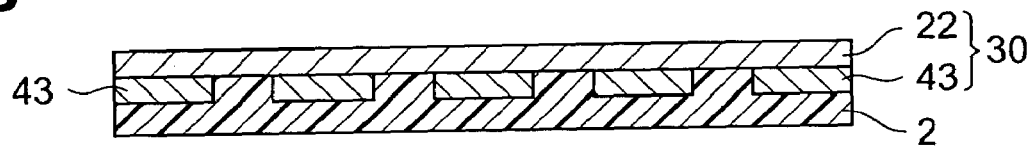
Figure 4D:
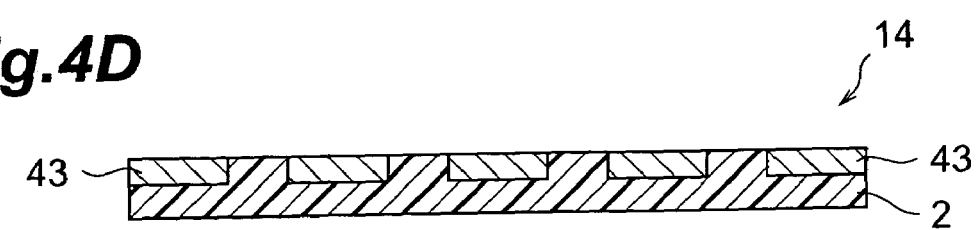

FIGS. 4A to 4D are sectional views showing a process of the fourth method for making the wiring board. In the fourth method, a transfer member 30 constituted by a support 22 on which a conductor layer 43 having a predetermined pattern has already been formed is prepared (FIG. 4A), and then is arranged on a composite dielectric sheet 2 such that the conductor layer 43 faces thereto (FIG. 4B). Subsequently, thus arranged composite dielectric sheet 2 and transfer member 30 are press-bonded together by press-forming or the like (FIG. 4C). Thereafter, only the support 22 in the transfer member 30 is eliminated from the laminate formed by press-bonding, whereby a wiring board 14 constituted by the composite dielectric sheet 2 having the conductor layer 43 with the predetermined pattern transferred thereto is obtained (FIG. 4D).

Figure 5A:
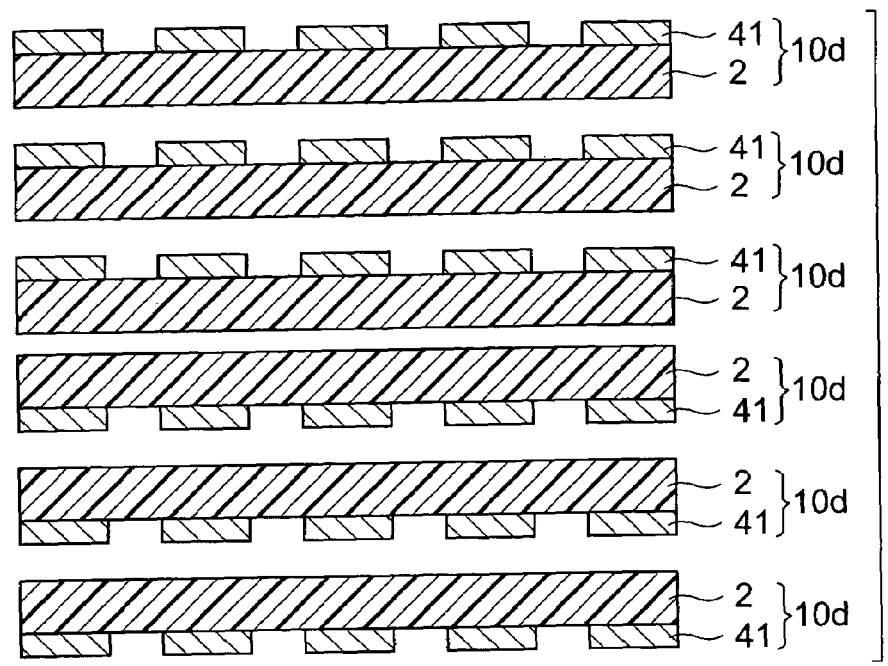
FIGS. 5A and 5B are sectional views showing a process of a first method for making a multilayer wiring board.
Figure 5B:
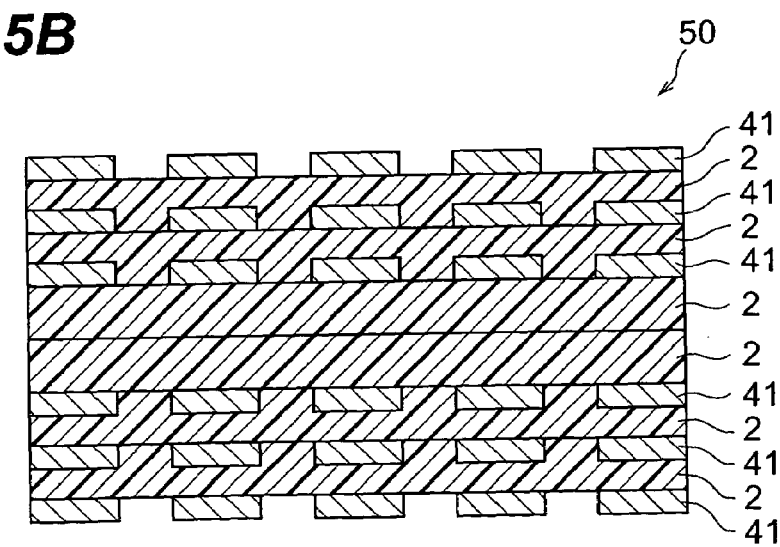

Laminating a plurality of thus obtained wiring boards can make a multilayer wiring board constituted by a plurality of composite dielectric sheets of the present invention alternating with a plurality of conductor layers each having a predetermined wiring pattern. FIGS. 5A and 5B are sectional views showing a first method for making the multilayer wiring board. In the first method, a plurality of wiring boards, each comprises a conductor layer 41 on only one face of a composite dielectric sheet 2, are prepared. From two wiring boards 10d arranged at the center such that their composite dielectric layers 2 face each other, the wiring boards 10d are successively stacked such that the conductor layers 41 are oriented outward (FIG. 5A). Thereafter, this laminate is vacuum-pressed while being heated and pressurized, and so forth, so as to yield a multilayer wiring board 50 (FIG. 5B). In this case, the respective conductor layers 41 in the wiring boards 10d may have patterns different from each other.

Figure 6A:
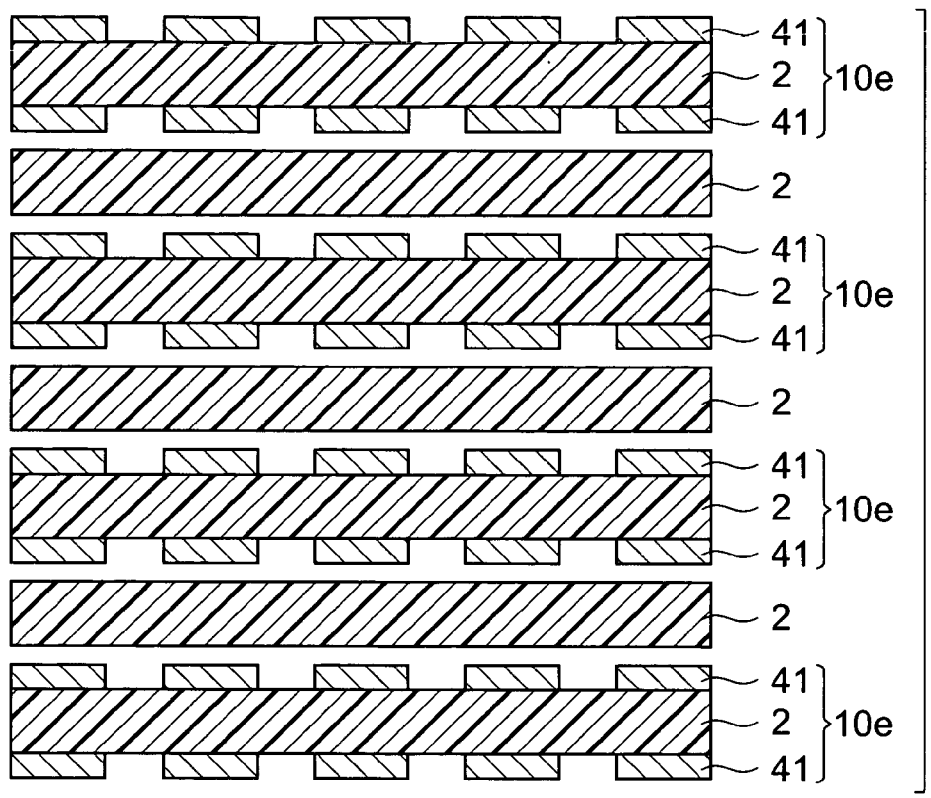
FIGS. 6A and 6B are sectional views showing a process of a second method for making a multilayer wiring board.
Figure 6B:
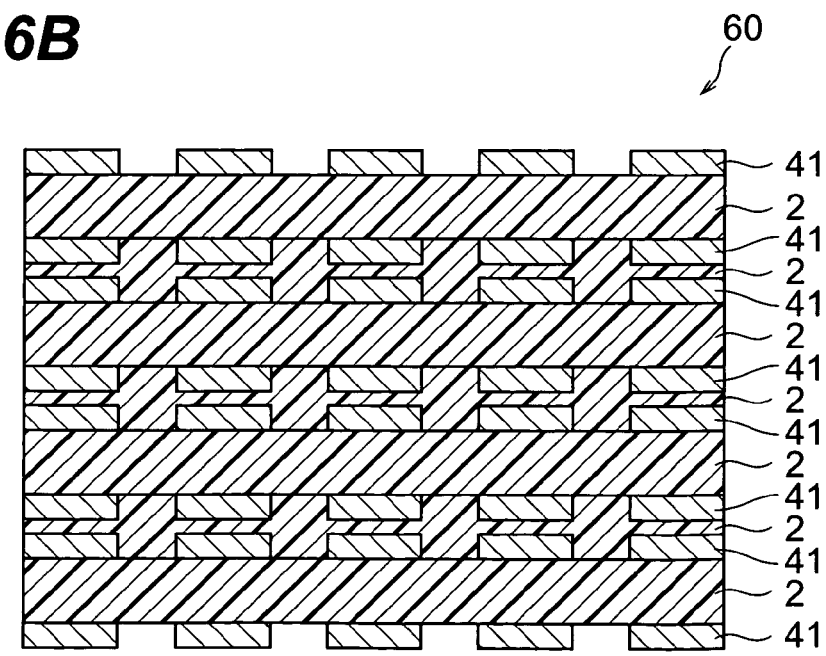

The multilayer wiring board can also be made by laminating a plurality of wiring boards 10e, each comprising a composite dielectric sheet 2 having both faces formed with conductor layers 41. FIGS. 6A and 6B are sectional views showing a second method for making the multilayer wiring board. In the second method, a plurality of wiring boards 10e, each comprising a composite dielectric having both faces formed with the conductor layers 41, are stacked so as to alternate with separately prepared composite dielectric sheets 2 (FIG. 6A). They are then press-bonded by means similar to those in the case of the multilayer wiring board 50, so as to yield a multilayer wiring board 60 (FIG. 6B). In the multilayer wiring board 60, the respective conductor layers 41 in the wiring boards 10e may have patterns different from each other as in the above-mentioned multilayer wiring board 50.

Since thus constructed wiring board and multilayer wiring board comprise the composite dielectric of the present invention exhibiting a high dielectric constant and high Q value at a frequency of 1 GHz as a substrate to be formed with a conductor layer, they have a characteristic of a high dielectric constant with a low dielectric dissipation factor, thereby exhibiting a characteristic of a very low loss when transmitting a signal in a high frequency region (1 to 5 GHz, 1 to 2 GHz in particular).

The composite dielectric sheet includes the aromatic liquid crystal polyester as a base resin, thereby exhibiting a high heat resistance together with a low water absorption. Therefore, the wiring board and multilayer wiring board of the present invention comprising the composite dielectric sheet are less likely to deteriorate even under a high-temperature condition at the time of making, and their dielectric characteristics drift less with time, so that they are excellent in durability.

Since the composite dielectric sheet exhibits a sufficient strength (bending strength, bend elastic constant, etc.) even when processed thin, the wiring board and multilayer wiring board comprising the same can be made much thinner and smaller.

In the following, the present invention will be explained in further detail with reference to examples, which do not restrict the scope of the present invention.

SYNTHESIS OF AROMATIC LIQUID CRYSTAL POLYESTER

SYNTHESIS EXAMPLE 1

Into a reactor equipped with a stirrer, a torque meter, a nitrogen gas feeding tube, a thermometer and a reflux condenser, 191.8 g (1.02 mol) of 2-hydroxy-6-naphthoic acid, 63.3 g (0.34 mol) of 4,4'-dihydroxybiphenyl, 56.5 g (0.34 mol) of isophthalic acid and 191 g (1.87 mol) of acetic anhydride were introduced. The inside of the reactor was sufficiently substituted by nitrogen gas, and the temperature therein was raised to 150° C. over 15 minutes under a nitrogen gas flow. Then, while the temperature was held at 150° C., reflux was carried out for 3 hours.

After the reflux, while evaporating acetic acid, which was a flowing-out byproduct, and the unreacted part of acetic anhydride, the temperature was raised to 320° C. over 170 minutes. A point where an increase in torque was seen was considered to be the end point of reaction, and the content of the reactor in this state was taken out. Thus obtained solid was cooled to room temperature and then was pulverized. The pulverized product was held at 250° C. for 10 hours in a nitrogen atmosphere, so as to advance a polymerization reaction in a solid phase, thereby yielding an aromatic liquid crystal polyester. Thus obtained aromatic liquid crystal polyester was dissolved in p-chlorophenol. The limiting viscosity of the resulting solution measured at 60° C. was 2.1.

SYNTHESIS EXAMPLE 2

Into a reactor equipped with a stirrer, a torque meter, a nitrogen gas feeding tube, a thermometer and a reflux condenser, 191.8 g (1.02 mol) of 2-hydroxy-6-naphthoic acid, 63.3 g (0.34 mol) of 4,4'-dihydroxybiphenyl, 56.5 g (0.34 mol) of isophthalic acid and 191 g (1.87 mol) of acetic anhydride were introduced. The inside of the reactor was sufficiently substituted by nitrogen gas, and the temperature therein was raised to 150° C. over 15 minutes under a nitrogen gas flow. Then, while the temperature was held at 150° C., reflux was carried out for 3 hours.

After the reflux, while evaporating acetic acid, which was a flowing-out byproduct, and the unreacted part of acetic anhydride, the temperature was raised to 320° C. over 170 minutes. A point where an increase in torque was seen was considered to be the end point of reaction, and the content of the reactor in this state was taken out. Thus obtained solid was cooled to room temperature and then was pulverized. The pulverized product was held at 260° C. for 10 hours in a nitrogen atmosphere, so as to advance a polymerization reaction in a solid phase, thereby yielding an aromatic liquid crystal polyester. Thus obtained aromatic liquid crystal polyester was dissolved in p-chlorophenol. The limiting viscosity of the resulting solution measured at 60° C. was 2.4.

PREPARATION OF COMPOSITE DIELECTRIC PASTE

EXAMPLE 1

While being stirred at 120° C., 5 g of the aromatic liquid crystal polyester obtained in Synthesis Example 2 were added to 95 g of p-chlorophenol, and were completely dissolved therein. As a dielectric ceramic powder, 2.3 g of $BaNd_2Ti_4O_{12}$ (manufactured by TDK Corporation, with an average particle diameter of 1.6 μm and ∈92/Q1700) were added to the solution, and mixed/dispersed therein, so as to yield a composite dielectric paste.

EXAMPLE 2

A composite dielectric paste was obtained as in Example 1 except that the amount of addition of $BaNd_2Ti_4O_{12}$, which was a dielectric ceramic powder, was 5.18 g.

EXAMPLES 3, 4, 5, and 6

Composite dielectric pastes were obtained as in Example 1 except that $BaNd_2Ti_4O_{12}$ (manufactured by TDK Corporation, with an average particle diameter of 1.6 μm and ∈90/Q1700) was used as a dielectric ceramic powder by respective amounts of addition of 8.88 g (Example 3), 13.81 g (Example 4), 20.71 g (Example 5) and 31.07 g (Example 6).

EXAMPLE 7

A composite dielectric paste was obtained as in Example 1 except that $Ba_2Ti_9O_{20}$ (manufactured by TDK Corporation, with an average particle diameter of 1.7 μm and ∈39/Q9000) was used as a dielectric ceramic powder by an amount of addition of 13.81 g.

REFERENCE EXAMPLE 1

A composite dielectric paste was obtained as in Example 1 except that $BaNd_2Ti_4O_{12}$ (manufactured by TDK Corporation, with an average particle diameter of 1.6 μm and ∈90/Q1700) was used as a dielectric ceramic powder by an amount of addition of 48.33

COMPARATIVE EXAMPLE 1

A composite dielectric paste was obtained as in Example 1 except that 5 g of the aromatic liquid crystal polyester obtained by Synthesis Example 1 were used and that no dielectric ceramic powder was added.

COMPARATIVE EXAMPLE 2

A composite dielectric paste was obtained as in Example 1 except that no dielectric ceramic powder was added.

COMPARATIVE EXAMPLE 3

A composite dielectric paste was obtained as in Example 1 except that 13.81 g of a barium titanate type dielectric ceramic powder (manufactured by KCM Corporation, with an average particle diameter of 7.0 μm and ∈1100/Q100) were used as a dielectric ceramic powder.

COMPARATIVE EXAMPLE 4

A composite dielectric paste was obtained as in Example 1 except that 31.07 g of a barium titanate type dielectric ceramic powder (manufactured by KCM Corporation, with an average particle diameter of 7.0 μm and ∈1100/Q100) were used as a dielectric ceramic powder.

Making of Composite Dielectric Sheet with Copper Foils on One Face

The composite dielectric pastes obtained by Examples 1 to 7, Reference Example 1, and Comparative Examples 1 to 4 were applied onto an electrolytic copper foil (F2-WS, manufactured by Furukawa Circuit Foil Co., Ltd., with Rz=1.7 μm and a thickness of 18 μm) by doctor blading and then was dried by heating at 100° C. for 7 minutes (hereinafter referred to as 100° C./7 min), 120° C./7 min, 150° C./1 hr, and 320° C./1 hr in succession, so as to yield a composite dielectric sheet with a copper foil on one face, in which the thickness of the composite dielectric sheet made of the composite dielectric was 50 μm and the total thickness was 70 μm.

Making of Composite Dielectric Sheet with Copper Foils on Both Faces

Two composite dielectric sheets, each having a copper foil on one face and obtained as mentioned above, were prepared and were stacked such that they were in contact with each other on the composite dielectric sheet side. Then, using a high-temperature vacuum press (KVHC type, manufactured by Kitagawa Seiki Co., Ltd.), the sheets were vacuum-pressed at a pressure of 3 MPa in a vacuum of about $1.33 \times 10^3$ Pa or less while being heated such that the temperature was raised at 5° C./min, held at 260° C. for 30 min, further raised at 5° C./min, and held at 320° C. for 10 min, whereby a composite dielectric sheet having a thickness of 140 μm with copper foils on both faces was obtained.

Making of Composite Dielectric Sheet

Thus obtained composite dielectric sheets were dipped into a ferric chloride solution, so as to eliminate their copper foils, thus yielding single-layer composite dielectric sheets each having a thickness of 50 μm. Subsequently, 20 single-layer composite dielectric sheets were stacked and, with a thickness-securing spacer (800 μm) disposed there about, were vacuum-pressed at a pressure of 3 MPa in a vacuum of about $1.33 \times 10^3$ Pa or less while being heated such that the temperature was raised at 5° C./min, held at 260° C. for 30 min, further raised at 5° C./min, and held at 320° C. for 10 min by using a high-temperature vacuum press (KVHC type, manufactured by Kitagawa Seiki Co., Ltd.), whereby a composite dielectric sheet having a thickness of 800 μm was obtained.

Evaluation of Sheet Characteristics

Characteristics of coatability, adhesion, dielectric constant, Q value, 180° copper foil peel strength, bending strength, bend elastic constant, water absorption, melting point, flame resistance, glass transition temperature, soldering heat resistance, and change in dielectric constant of the composite dielectric sheets with copper foils on one or both faces obtained as mentioned above by using the composite dielectric pastes of Examples 1 to 7, Reference Example 1, and Comparative Examples 1 to 4 were evaluated by the following methods. Tables 1 and 2 show thus obtained results together with the respective compositions of the composite dielectrics used.

Coatability

The coating surface of the composite dielectric in each composite dielectric sheet having a metal foil on one face was visually observed so as to see whether irregularities and the like were formed or not, whereby the smoothness of the coating surface was evaluated. In the tables, "good" indicates smooth coating surfaces, whereas "poor" indicates those failing to yield smooth coating surfaces because of irregularities formed therein, etc.

Adhesion

Each composite dielectric sheet having metal foils on both faces was cut into an adhesion (press flowability) evaluating sample having a length of 100 mm and a width of 40 mm. This sample was subjected to water absorption at 60° C., 90% RH for 48 hours and then three reflows of max 260° C./3 sec or more. Thereafter, the sample was visually observed, so as to see whether peeling occurred between layers or not, whereby the adhesion (press flowability) of the composite dielectric sheet to the copper foil was evaluated. In the tables, "good" indicates those in which no peeling was seen, whereas "poor" indicates those in which peeling was seen.

Dielectric Constant and Q Value

Each composite dielectric sheet was cut into a dielectric constant and Q value measuring sample having a length of 100 mm, a width of 1.5 mm, and a thickness of 0.8 mm. Using a complex dielectric constant measuring apparatus based on perturbation method with a cavity resonator (manufactured by Kanto Electronics Application and Development Inc.; cavity: CP 431 (1 GHz) or CP 461 (2 GHz); measurement program: CPMA-S1/V1), the dielectric constant and Q value of each sample were calculated from displacement in the resonance frequency and Q value obtained when the sample was put into and taken out from the cavity of 1 GHz or 2 GHz.

180° Copper Foil Peel Strength

For each composite dielectric sheet having a copper foil on one face, the 180° copper foil peel strength was measured by pulling the copper foil in the direction of 180° according to JIS (Japanese Industrial Standards) C6481.

Bending Strength and Bend Elastic Constant

The bending strength and bend elastic constant were measured by respective methods in compliance with JIS C6481.

Water Absorption

Each composite dielectric sheet was cut into a water absorption measuring sample having a length of 50 mm, a width of 50 mm, and a thickness of 0.8 mm. After measuring the weight, the sample was subjected to water absorption processing by being dipped into water at 23° C. for 120 hours (condition 1) or being left for 120 hours in a test bath at 60° C., 90% RH (condition 2), and then the sample weight after the water absorption processing was measured. From thus obtained sample weights before and after the processing, the water absorption was calculated according to the following expression:

(water absorption (%))=((weight before processing)/ (weight before processing))×100

Melting Point

A sample of 30 mg was cut out from each composite dielectric sheet. Using a differential scanning calorimeter (DSC-50, manufactured by Shimadzu Corp.), each sample was analyzed within the temperature range from room temperature to 400° C. at a rate of 10° C./min, and the melting point was calculated from thus obtained endothermic peak.

Flame Resistance

Each composite dielectric sheet was cut into a flame resistance test sample having a length of 127 mm, a width of 12.7 mm, and a thickness of 0.8 mm, which was then subjected to a flame resistance test in conformity to UL94 V-0 test. Namely, those exhibiting a flamed burning duration of 10 seconds or less per flaming when flaming was effected twice, each for 10 seconds, and a total flamed burning duration of 50 seconds or less when five samples were subjected to the same test, under which absorbent cotton placed below the sample did not ignite upon dripping during the burning, were determined as V-0.

Glass Transition Temperature

Each composite dielectric sheet was cut into a glass transition temperature measuring sample having a length of 60 mm, a width of 10 mm, and a thickness of 0.8 mm. Using a DMA (Dynamic mechanical analysis) apparatus (manufactured by Seiko Corp.), the sample was measured in a pulling mode from room temperature to 300° C. at a rate of 2° C./min, and the glass transition temperature was determined from a peak of tan δ.

Soldering Heat Resistance

Each composite dielectric sheet having copper foils on both faces was cut into a soldering heat resistance measuring sample having a length of 50 mm and a width of 50 mm. The sample was dipped into a solder bath at 270° C. for 30 seconds, and the sample after the dipping was visually observed to see whether or not peeling, cracking, bulging, etc. occurred in the copper foils, thereby evaluating the soldering heat resistance. In the tables, "good" indicates those without peeling, cracking, bulging, etc., whereas "poor" indicates those exhibiting the same.

Dielectric Constant Change

Each composite dielectric sheet with metal foils on both faces was cut into a dielectric constant change measuring sample having a length of 100 mm, a width of 1.5 mm, and a thickness of 0.8 mm. After measuring the dielectric constant, the sample was processed at 85° C., 85% RH for 400 hours, and the dielectric constant of the sample after the processing was measured. From thus obtained dielectric constants before and after the processing, the ratio of change in dielectric constant was calculated according to the following expression. The dielectric constant at a frequency of 2 GHz was measured as in the above-mentioned method for the dielectric constant and Q value:

(ratio of change (%))={(dielectric constant after processing)−(dielectric constant before processing))/(dielectric constant before processing)}×100

TABLE 1

| | | Example 1 | Example 2 | Example 3 | Example 4 | Example 5 | Example 6 | Example 7 |
|---|---|---|---|---|---|---|---|---|
| Aromatic liquid crystal polyester | Synthesis Exampe 1 | — | — | — | — | — | — | — |
| | Synthesis Example 2 | 5 | 5 | 5 | 5 | 5 | 5 | 5 |
| Dielectric ceramic powder | $BaNd_2Ti_4O_{12}$ | 2.3 | 5.18 | 8.88 | 13.81 | 20.71 | 31.07 | — |
| | $Ba_2Ti_9O_{20}$ | — | — | — | — | — | — | 13.81 |
| | Barium titanate | — | — | — | — | — | — | — |
| Solvent | p-chlorophenol | 95 | 95 | 95 | 95 | 95 | 95 | 95 |
| Dielectric ceramic powder compounding ratio (parts by volume) | | 11 | 25 | 42.9 | 66.7 | 100 | 150 | 66.7 |
| Coatability | | good | good | good | good | good | good | good |
| Adhesion | | good | good | good | good | good | good | good |
| Dielectric constant | 1 GHz | 4.7 | 7.0 | 10.36 | 14.2 | 20.2 | 27.2 | 10.8 |
| | 2 GHz | 4.6 | 6.9 | 10.2 | 14.1 | 20.1 | 27.1 | 10.7 |
| Q value | 1 GHz | 732 | 731 | 743 | 752 | 751 | 759 | 814 |
| | 2 GHz | 694 | 689 | 701 | 708 | 714 | 721 | 725 |
| 180° peel strength (N/cm) | | 5.8 | 5.7 | 5.6 | 5.7 | 5.8 | 5.7 | 5.6 |
| Bending strength (MPa) | | 84 | 100 | 114 | 131 | 142 | 156 | 128 |
| Bend elastic constant (GPa) | | 5.6 | 8.0 | 10.0 | 12.3 | 14.2 | 15.6 | 12.4 |
| Water absorption (%) | condition 1 | 0.068 | 0.061 | 0.045 | 0.028 | 0.016 | 0.012 | 0.029 |
| | condition 2 | 0.058 | 0.056 | 0.054 | 0.045 | 0.032 | 0.026 | 0.045 |
| Melting point (° C.) | | 324 | 325 | 327 | 323 | 325 | 324 | 327 |
| Flame resistance | | V-0 | V-0 | V-0 | V-0 | V-0 | V-0 | V-0 |
| Glass transition temp (° C.) | | 167 | 169 | 170 | 172 | 172 | 171 | 171 |
| Soldering heat resistance | | good | good | good | good | good | good | good |
| Ratio of change in dielectric constant (Δ ϵ) (%) | | 0.44 | 0.41 | 0.37 | 0.32 | 0.28 | 0.22 | 0.30 |

TABLE 2

| | | Ref. Example 1 | Comp. Example 1 | Comp. Example 2 | Comp. Example 3 | Comp. Example 4 |
|---|---|---|---|---|---|---|
| Aromatic liquid crystal polyester | Synthesis Example 1 | — | 5 | — | — | — |
| | Synthesis Example 2 | 5 | — | 5 | 5 | 5 |
| Dielectric ceramic powder | $BaNd_2Ti_4O_{12}$ | 48.33 | — | — | — | — |
| | $Ba_2Ti_9O_{20}$ | — | — | — | — | — |
| | Barium titanate | — | — | — | 13.81 | 31.07 |
| Solvent | p-chlorophenol | 95 | 95 | 95 | 95 | 95 |
| Dielectric ceramic powder compounding ratio | | 233.3 | 0 | 0 | 66.7 | 150 |

TABLE 2-continued

|  |  | Ref. Example 1 | Comp. Example 1 | Comp. Example 2 | Comp. Example 3 | Comp. Example 4 |
|---|---|---|---|---|---|---|
| (parts by volume) | | | | | | |
| Coatability | | poor | good | good | good | good |
| Adhesion | | poor | good | good | good | good |
| Dielectric | 1 GHz | 36.9 | 3.4 | 3.4 | 19.6 | 46.5 |
| constant | 2 GHz | 36.7 | 3.3 | 3.3 | 19.4 | 46.1 |
| Q value | 1 GHz | 752 | 603 | 614 | 75 | 71 |
|  | 2 GHz | 716 | 645 | 683 | 69 | 64 |
| 180° peel strength (N/cm) | | 4.1 | 5.8 | 5.6 | 5.7 | 5.6 |
| Bending strength (MPa) | | — | 71 | 69 | 126 | 148 |
| Bend elastic constant (GPa) | | — | 3.5 | 3.6 | 13.8 | 15.1 |
| Water absorption (%) | condition 1 | — | 0.078 | 0.074 | 0.03 | 0.014 |
|  | condition 2 | — | 0.061 | 0.062 | 0.046 | 0.031 |
| Melting point (° C.) | | 328 | 305 | 325 | 326 | 325 |
| Flame resistance | | V-0 | V-0 | V-0 | V-0 | V-0 |
| Glass transition temp (° C.) | | 173 | 145 | 168 | 170 | 171 |
| Soldering heat resistance | | — | good | good | good | good |
| Ratio of change in dielectric constant ($\Delta \epsilon$) (%) | | 0.17 | 0.55 | 0.47 | 0.31 | 0.21 |

What is claimed is:

1. A composite dielectric containing:
an aromatic liquid crystal polyester; and
a dielectric ceramic powder provided in the aromatic liquid crystal polyester;
wherein the composite dielectric exhibits a Q value of greater than 650 at a frequency of 1 GHz by perturbation method;
wherein the dielectric ceramic powder includes at least one kind of metal oxide selected from a group consisting of $Mg_2SiO_4$, $MgTiO_3$, $ZnTiO_3$, $Zn_2TiO_4$, $CaTiO_3$, $SrZrO_3$, $Ba_2Ti_9O_{20}$, $Ba_2(Ti,Sn)_9O_{20}$, $ZrTiO_4$, $(Zn,Sn)TiO_4$, $BaNd_2Ti_5O_{14}$, $BaNd_2Ti_4O_{12}$, $BaSm_2TiO_{14}$, $BaO—CaO—Nd_2O_3—TiO_2$ system, $BaO—SrO—Nd_2O_3—TiO_2$ system, $Bi_2O_3—BaO—Nd_2O_3—TiO_2$ system, $PbO—BaO—Nd_2O_3—TiO_2$ system, $(Bi_2O_3, PbO)—BaO—Nd_2O_3—TiO_2$ system, $La_2Ti_2O_7$, $Nd_2Ti_2O_7$, $(Li, Sm)TiO_3$, $Ba(Mg_{1/3}Nd_{2/3})O_3$, $Ba(Zn_{1/3}Ta_{2/3})O_3$, $Ba(Zn_{1/3}Nd_{2/3})O_3$ and $Sr(Zn_{1/3}N_{2/3})O_3$.

2. A composite dielectric according to claim 1,
wherein the aromatic liquid crystal polyester is a polymer soluble in a solvent containing at least 30% by weight of a compound represented by the following general formula (1a) or (1b):

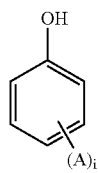
(1a)

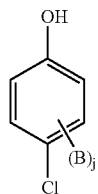
(1b)

wherein
A represents a halogen atom or a trihalogenated methyl group;
B represents a hydrogen atom, a halogen atom or a trihalogenated methyl group;
i represents an integer of 1 to 5;
j represents an integer of 1 to 4.

3. A composite dielectric according to claim 1,
wherein the aromatic liquid crystal polyester is a polymer having an aromatic hydroxycarboxylic acid monomer unit.

4. A composite dielectric according to claim 1,
wherein the aromatic liquid crystal polyester is a polymer constituted by 30 to 80 mol % of an aromatic hydroxycarboxylic acid monomer unit, 10 to 35 mol % of an aromatic diol monomer unit and 10 to 35 mol % of an aromatic dicarboxylic acid monomer unit.

5. A composite dielectric according to claim 3,
wherein an aromatic hydroxycarboxylic acid forming the aromatic hydroxycarboxylic acid monomer unit is 2-hydroxy-6-naphthoic acid.

6. A composite dielectric according to claim 4,
wherein an aromatic diol forming the aromatic diol monomer unit is 4,4'-dihydroxybiphenyl, and
an aromatic dicarboxylic acid forming the aromatic dicarboxylic acid monomer unit is at least one kind of compound selected from the group consisting of terephthalic acid, isophthalic acid and 2,6-naphthalenedicarboxylic acid.

7. A composite dielectric according to claim 1,
wherein the dielectric ceramic powder exhibits a dielectric constant of at least 7 but less than 300, and a Q value of at least 700 at a frequency of 1 GHz by perturbation method.

8. A composite dielectric according to claim 1,
wherein the dielectric ceramic powder has a content of 11 to 150 parts by volume with respect to 100 parts by volume of the aromatic liquid crystal polyester.

9. A composite dielectric paste comprising:
the composite dielectric according to claim 1; and
a solvent that dissolves the aromatic liquid crystal polyester in the composite dielectric.

10. A composite dielectric sheet,
wherein the sheet consists of the composite dielectric according to claim 1.

11. A composite dielectric sheet according to claim 10,
wherein the sheet has a thickness of 1 to 1000 μm.

12. A metal-layered composite dielectric sheet comprising:
the composite dielectric sheet according to claim 10; and
a metal layer provided on at least one face of the composite dielectric sheet.

13. A wiring board comprising:
the composite dielectric sheet according to claim 10; and
a conductor layer with a predetermined wiring pattern provided on at least one face of the composite dielectric sheet.

14. A multilayer wiring board comprising:
a plurality of composite dielectric sheets according to claim 10; and
a plurality of conductor layers with a predetermined wiring pattern;
wherein the composite dielectric sheets and the conductor layers are provided alternately.

* * * * *